United States Patent [19]
Churchill

[11] Patent Number: 5,570,043
[45] Date of Patent: Oct. 29, 1996

[54] OVERVOLTAGE TOLERANT INTERGRATED CIRCUIT OUTPUT BUFFER

[75] Inventor: Jonathan F. Churchill, Berkshire, England

[73] Assignee: Cypress Semiconductor Corporation, San Jose, Calif.

[21] Appl. No.: 381,125

[22] Filed: Jan. 31, 1995

[51] Int. Cl.$^6$ ............................................. H03K 17/16
[52] U.S. Cl. ................................. 326/81; 326/27; 326/21
[58] Field of Search ............................... 326/27, 21, 81; 327/534, 537

[56] References Cited

U.S. PATENT DOCUMENTS

| | | | |
|---|---|---|---|
| 4,782,250 | 11/1988 | Adams et al. | |
| 4,963,766 | 10/1990 | Lundburg | 326/81 |
| 5,144,165 | 9/1992 | Dhong | 326/83 |
| 5,151,619 | 9/1992 | Austin et al. | |
| 5,160,855 | 11/1992 | Dobberpuhl | |
| 5,266,849 | 11/1993 | Kitahara | 327/534 |
| 5,300,832 | 4/1994 | Rogers | |
| 5,338,978 | 8/1994 | Larsen | 326/21 |
| 5,381,061 | 1/1995 | Davis | 327/534 |
| 5,396,128 | 3/1995 | Dunning | 326/21 |
| 5,444,397 | 8/1995 | Wong | 326/81 |

OTHER PUBLICATIONS

Daniel W. Dobberpuhl et al., "A 200-MHz 64-b Dual-Issue CMOS Microprocessor" IEEE Journal of Solid-State Circuits, vol. 27, No. 11, pp. 1555–1567 (Nov. 1992).

*Primary Examiner*—Edward P. Westin
*Assistant Examiner*—Andrew Sanders
*Attorney, Agent, or Firm*—Blakely, Sokoloff, Taylor & Zafman

[57] ABSTRACT

An overvoltage tolerant output buffer circuit for coupling an integrated circuit (IC) to external electrical apparatus by way of a contact pad or other input/output connection. An overvoltage protection circuit is provided to bias the semiconductor or well region containing the pull-up driving transistors of the output buffer so as to reduce current injected to the supply rail of the IC from the contact pad during an overvoltage condition. The protection circuit is arranged to bias the substrate on the basis of a potential difference between the supply rail and the contact pad so that neither of the supply rail and contact pad substantially exceeds the potential of the substrate. Circuitry is also provided to block signals from being passed to the buffer circuit from other circuits on the IC, and for preventing a gate-source potential difference from being applied to the pull-up driving transistors during the overvoltage condition.

16 Claims, 5 Drawing Sheets

OVERVOLTAGE TOLERANT INTERGRATED CIRCUIT OUTPUT BUFFER

FIELD OF THE INVENTION

This invention relates to an overvoltage tolerant buffer circuit which is suitable for driving an integrated circuit I/O (input/output) connection.

ART BACKGROUND

An increase in the number of fabrication processes available for manufacturing integrated circuits has lead to an increased diversity in operating conditions under which the integrated circuits perform. For example, the range of supply voltages, switching voltages, input and output voltages can vary as between integrated circuits fabricated by different processes. In order for an integrated circuit to be compatible with circuits manufactured using a different process, it may therefore be necessary for the integrated circuit to be tolerant of voltages on the I/O connections thereof which are different from voltages which may be received from a circuit manufactured using the same fabrication process.

One particular problem which has been encountered is the application of a voltage to an I/O connection which is higher that the supply voltage for the integrated circuit. This is referred to as an overvoltage condition at the I/O connection. For example, complimentary metal oxide semiconductor (CMOS) circuits can be manufactured to operate on a supply voltage of 3 volts (where the rail to rail voltage swing is 3 volts), while many other circuits utilize a 5 volt supply and can thus be expected to produce an output in the region of 5 volts. If a 3 volt CMOS circuit receives an input of 5 volts at an I/O connection thereof (an overvoltage condition), difficulties can be encountered within an output buffer circuit of the 3 volt CMOS circuit. In particular, an undesirably large leakage current from the I/O connection through the output buffer of the 3 volt CMOS circuit may arise as a result of the overvoltage condition. Additionally, latch up of the CMOS circuit can occur as a result of the overvoltage condition. Both of these phenomena are detrimental to the operation of the CMOS circuit, and can in extreme circumstances result in destruction of the circuit.

A simplified CMOS output buffer circuit 2 is illustrated in FIG. 1 for driving an I/O connection 8, such as a contact pad of an integrated circuit (IC), which contains the buffer 2, in accordance with signals received on control lines 15. The circuit 2 comprises a PMOS pull up transistor 4 which couples the I/O connection 8 by way of an output line 11 (labeled OUT) to a supply voltage line 10 (labeled $V_{CC}$). An NMOS pull down transistor 6 couples the I/O connection 8 to another supply voltage such as $V_{SS}$ or ground (GND). In operation, the pull up and pull down transistors 4, 6 are controlled by way of the control lines 15 so as to selectively couple the I/O connection 8 to the supply rail 10 or $V_{SS}$/GND which enables the output voltage to swing between $V_{SS}$ (e.g. zero volts) and $V_{CC}$ (the supply voltage). In order for the output buffer circuit 2 to drive the I/O connection 8 all the way to the positive supply voltage $V_{CC}$ the pull up transistor 4 must be a PMOS type transistor in order to avoid the undesirable voltage drop which would occur were an NMOS type transistor is used for this function.

In a CMOS fabrication process, the PMOS and NMOS transistors which make up the integrated circuit are fabricated in separate regions of the silicon substrate, the P type transistors in an N type region, and the N type transistors in a P type region. One way in which this is achieved is to dope the semiconductor wafer with a P type majority carrier in which the N type transistors can be formed, and to form discrete N type "well" regions in which the P type transistors are fabricated, which is referred to as an n-well CMOS process. Typically the n-well substrate regions are biased to the supply voltage of the integrated circuit, which promotes proper operation of the transistors formed therein.

An equivalent circuit 20 of the output buffer circuit 2 is shown in FIG. 2, which illustrates a result of the application of an overvoltage condition to the I/O connection 8. An electrical apparatus 12 is shown connected to the buffer 2 by way of the I/O connection 8. The apparatus 12 may, for example, be another integrated circuit which operates at a higher supply voltage (e.g. 5 v) than the IC which contains buffer 2. When the electrical apparatus 12 raises the potential of output line 11 above the supply voltage $V_{CC}$ of the output buffer, the drain terminal of the pull up transistor 4 is raised above the potential of both the gate terminal thereof and the substrate region in which the transistor is formed. This causes the P type pull-up transistor 4 to turn on which creates a current path from the output line 11 to the supply line 10, and also causes the drain-substrate diode of the transistor 4 to be forward biased, creating another current path from the output line to the $V_{CC}$ supply line. These current paths are indicated by dashed lines in FIG. 2. This situation at best stops the voltage at the I/O connection from rising much above the $V_{CC}$ supply voltage of the IC which contains buffer 2, but can also cause CMOS latch-up in this integrated circuit because of the injected current.

A similar situation occurs during "hot" or "live insertion". In this case, the I/O connections of an integrated circuit device are assumed to be conditioned (i.e., non-zero voltage) before the power supply is connected thereto. Even though the voltage applied to the I/O connections may not be an overvoltage in the sense of being greater than the operating supply voltage of the device, the instantaneous voltage at the I/O connections is nevertheless greater than the voltage applied to the power supply line when power is connected (ramped) to the device. In this instance, a major concern is latch-up if excessive current is injected from the I/O connection.

It is apparent from the forgoing discussion that it is desirable to provide an output buffer circuit which is capable of tolerating the application of an overvoltage condition to the corresponding I/O connection, and which is capable of supporting "live-insertion" whilst minimizing the extent of current injection from the I/O connection when the electrical potential therein is greater than the potential at the power supply line of the buffer circuit. It is also desirable to provide such a buffer circuit using simple, N-well CMOS technology without necessarily requiring the use of bipolar technology and/or charge pumping circuits.

SUMMARY OF THE INVENTION

In order to minimize injected current from the I/O connection (e.g. a contact pad) of an integrated circuit semiconductor device it has been found that regulation of a bias voltage applied to the region of the semiconductor substrate in which driving transistors of an output buffer associated with the I/O connection are fabricated can be utilized to ensure that the substrate bias potential is not substantially exceeded by the potential at the I/O connection. In a CMOS application where a PMOS pull-up transistor circuit is employed for the pull-up portion of the output buffer, this bias voltage regulation ensures that the drain to substrate junction diode formed by the pull-up transistor does not become forward biased so as to conduct injected current from the I/O connection.

According to one aspect of the invention there is provided an integrated circuit output buffer which includes a driving circuit having at least one pull-up transistor formed on a substrate, and which is capable of tolerating an overvoltage condition at the input/output connection. The substrate is coupled to a voltage supply rail of the integrated circuit, which provides a reference voltage to circuits in the IC, and to the input/output connection by means of an overvoltage protection circuit which is responsive to a potential difference as between the voltage supply rail and the I/O connection. The overvoltage protection circuit applies a bias potential to the substrate on the basis of the potential difference so as to prevent the potential at conduction terminals of the at least one pull-up transistor from substantially exceeding the potential of the substrate.

In an embodiment of the invention, the overvoltage protection circuit comprises first and second bias transistors coupled in series from the voltage supply rail to the input/output connection, the node between the series connected bias transistors being coupled to the substrate, the control node of the first transistor being controlled by the input/output connection potential and the control node of the second transistor being controlled by the supply rail potential.

The output buffer of the invention is particularly applicable to a CMOS integrated circuit in which the at least one pull-up transistor comprises a PMOS transistor constructed in an n-well region of the semiconductor substrate.

Additional circuitry may be included to further protect against detrimental effects of overvoltage, such as a circuit for coupling the gate node of the at least one pull-up transistor to the input/output connection upon detection of an overvoltage condition. This prevents increased potential at a conduction terminal of the pull-up transistor from turning the transistor on and forming a current path to the supply rail.

According to another aspect of the invention, a semiconductor input/output interface circuit is provided which comprises at least one driving transistor constructed in a region of a semiconductor substrate, coupled to drive an input/output port from a voltage supply rail, and overvoltage protection circuit. The overvoltage protection circuit comprises a first bias transistor coupled between the voltage supply rail and a first node and controlled by the voltage at the input/output port, and a second bias transistor coupled between the first node and the input/output port and controlled by the voltage at the supply rail. The first node is electrically coupled to the region of the substrate such that the region is biased substantially to the voltage of greater magnitude as between the supply rail voltage on the voltage supply rail and the input/output port voltage.

A further aspect of the invention provides a method for reducing current injected into an integrated circuit from an input/output connection thereof during application of an overvoltage condition at the input/output connection, for use in a semiconductor integrated circuit which comprises an output buffer for driving the input/output connection and including at least one pull-up transistor constructed in a region of a semiconductor substrate, the method comprising applying a bias potential to said region on the basis of a potential difference between a supply rail voltage of the integrated circuit and a voltage at the input/output connection.

Preferably the bias potential applied to the region is a potential substantially equal to the potential of greater magnitude as between the supply rail voltage and the input/output connection voltage.

Where the at least one pull-up transistor is a PMOS transistor constructed in an n-well region of the substrate and is coupled to the voltage supply rail and input/output connection, the method can further include the steps of sensing an overvoltage condition and coupling the gate node of the at least one pull-up transistor to the input/output connection on sensing said overvoltage condition.

In this specification, where an overvoltage condition is referred to, this is to be taken to include both the condition in which the potential at an input/output connection exceeds the normal operating potential of the integrated circuit (e.g. exceeds the reference voltage on the voltage supply rail), and also the "live insertion" condition referred to above in which the I/O -connection is initially at a greater potential than the integrated circuit supply rail while the supply rail is connected to a power source. In practice, for a 3 volt rated CMOS integrated circuit, "5 volt tolerance" is the ability of the 3 volt rated IC to limit injected current from an I/O connection to less then 100 micro amps per I/O connection when external apparatus applies a 5.5 volt potential to the I/O connection when the $V_{CC}$ supply rail is 3.0 volts.

Also, it is to be understood that, although the output buffer of the present invention is often referred to as being coupled to an input/output connection, this is not to be construed as meaning that an integrated circuit which contains the output buffer be capable of receiving signals applied to the input/output connection externally from the IC. For example, the I/O connection may in fact operate simply as an output for the integrated circuit, being driven by the output buffer of the invention. In such a case the I/O connection may be coupled, for example, to an external bus to which an output of another electrical circuit (having a higher operating voltage) is also coupled, by means of which an overvoltage could be applied to the I/O connection. Alternatively, the I/O connection to which the output buffer of the invention is coupled may also be coupled to input buffer circuitry of the IC, in which case the I/O connection is adapted both to drive the I/O connection by way of the output buffer, and also to have the I/O connection driven by signals from external electrical circuitry so as to be received by the input buffer.

Additionally, where "conduction terminals" of a transistor are referred to this is to be taken as a reference to source/drain terminals or collector/emitter terminals, as opposed to gate or base terminals or nodes which are sometimes referred to as a "control node" or "control terminal". It is to be recognized that particularly in MOS type integrated circuit transistors, the fabricated devices are oftentimes symmetrical, which allows the terms source and drain to sometimes be employed interchangeably depending upon the relative potentials applied thereto.

BRIEF DESCRIPTION OF THE DRAWINGS

The objects, features and advantages of the present invention will become apparent to one skilled in the art from reading the following detailed description in which.

DETAILED DESCRIPTION OF THE INVENTION

The invention is described in greater detail hereinafter, by way of example only, with reference to a preferred embodiment thereof. In the following description, numerous specific details are set forth such as examples of voltages and particular transistor configurations, etc. in order to provide a thorough understanding of the present invention. It will be evident, however, to those skilled in the art that such specific details are not necessarily required in order to practice the invention. In other instances, well known structures and circuit not relating to the crux of the invention have been omitted or simplified in order to avoid unnecessarily obscuring the invention.

Figure 7:
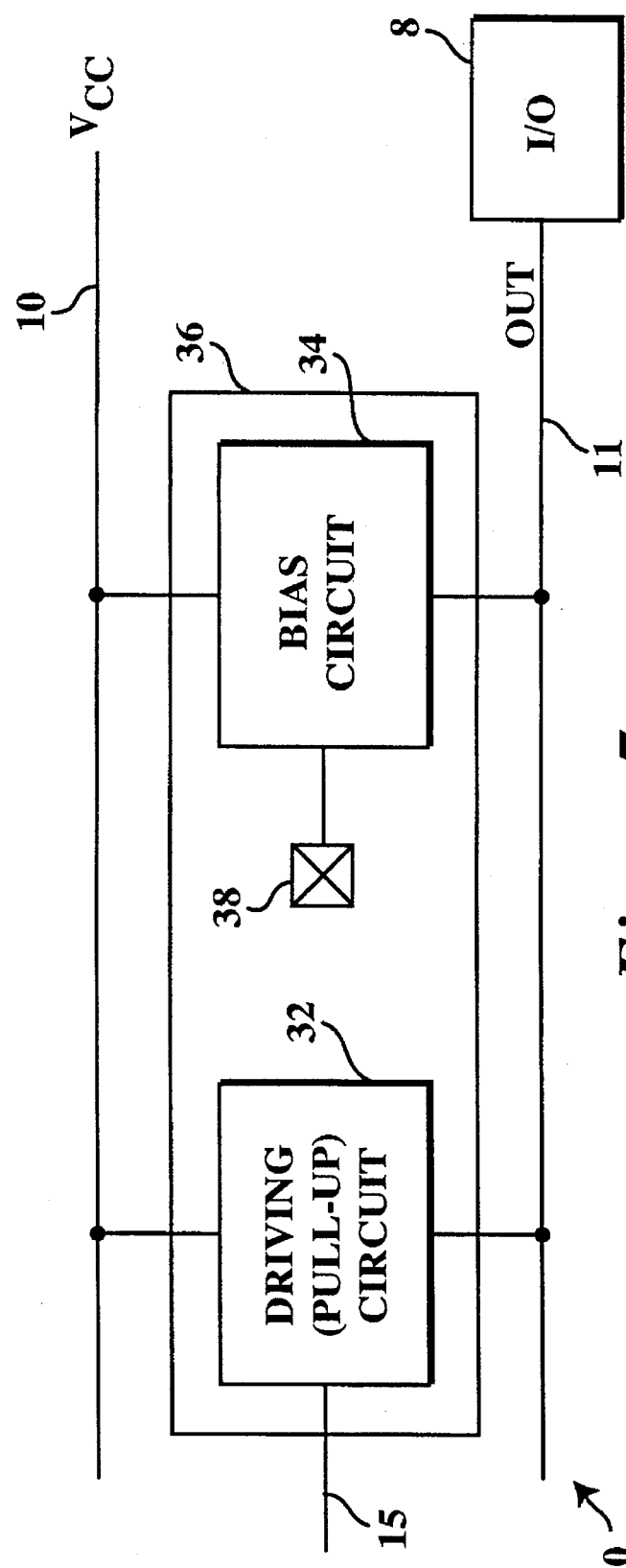
FIG. 7 is a block diagram of bias circuitry in accordance with one aspect of the invention.

Referring firstly to FIG. 7, there is shown a block diagram of a circuit 30 embodying one aspect of the invention relating to biasing circuitry for a pull-up driving circuit. The circuit 30 illustrates a pull-up portion of an output driver for passing signals from an output control line 15 of an integrated circuit to an input/output connection 8, such as a contact pad. The circuit 30 is fabricated using an n-well CMOS technology. As mentioned above, the pull-up portion of a CMOS output buffer is advantageously formed utilizing PMOS driving transistors, arranged to form the driving (pull-up) circuit 32 of the circuit 30, which enables the output line 11 to be selectively coupled to the supply line 10 under control of the output control line 15. It will be appreciated that supply line 10 (sometimes referred to as a voltage supply rail) provides a reference voltage ($V_{CC}$) to circuits on the IC.

The PMOS transistors forming the driving circuit 32 are constructed in an n-well 36 in the p substrate or layer, and the n-well 36 is conventionally maintained at the same potential as the supply line 10 to facilitate proper switching of the PMOS driving transistors. However, if an overvoltage is asserted on the output line 11 by external apparatus coupled to I/O connection 8, undesirably large leakage currents can result through the driving transistors and into the supply line 10 by way of its connection to the n-well region. A region bias circuit 34 is therefore provided which is coupled to the supply line 10 and the output line 11, and has a connection 38 to the n-well region 36. The bias circuit 34 ensures that the potential on the output line 11 does not raise substantially above the potential of the region 36. This is achieved by selectively coupling the region 36, by way of the region connection 38, to one of the supply line 10 and the output line 11 according to which of these lines has a higher potential. This ensures that the drain/source to n-well diodes of any PMOS transistors fabricated within the n-well 36 do not become forward biased, regardless of the voltage on the output line 11 with respect to the supply line 10.

Figure 1:
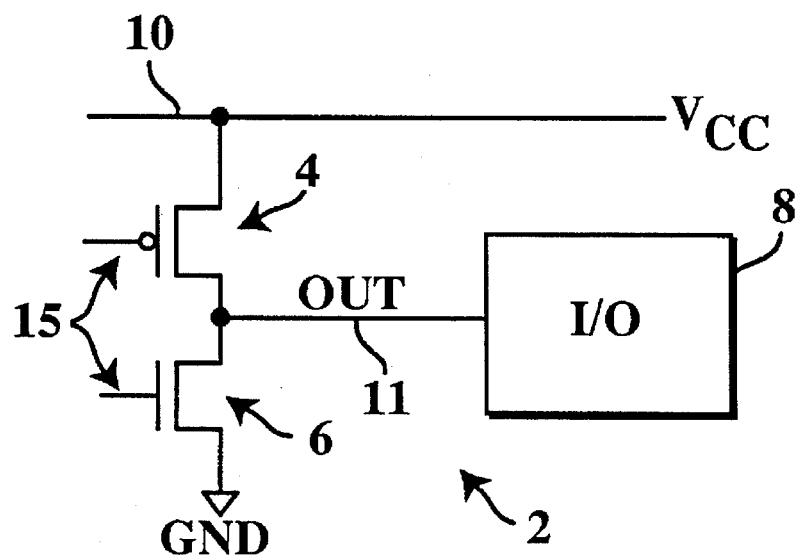
FIG. 1 is a circuit diagram of a simple CMOS output buffer.
Figure 2:
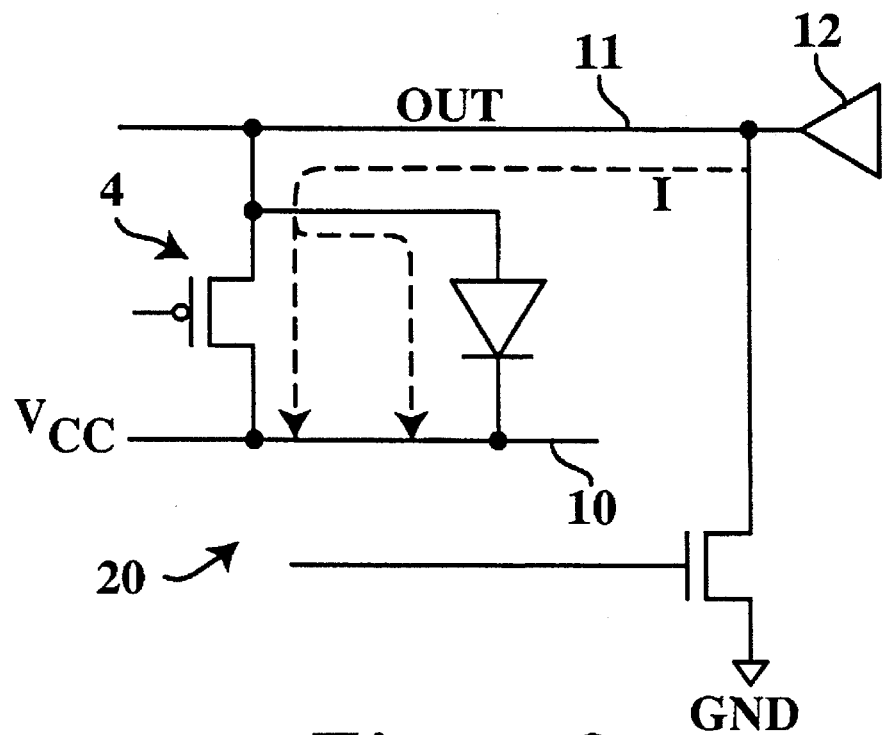
FIG. 2 is an equivalent circuit of the CMOS output buffer of FIG. 1 in the case where an overvoltage condition is applied at an input/output connection thereof.
Figure 3:
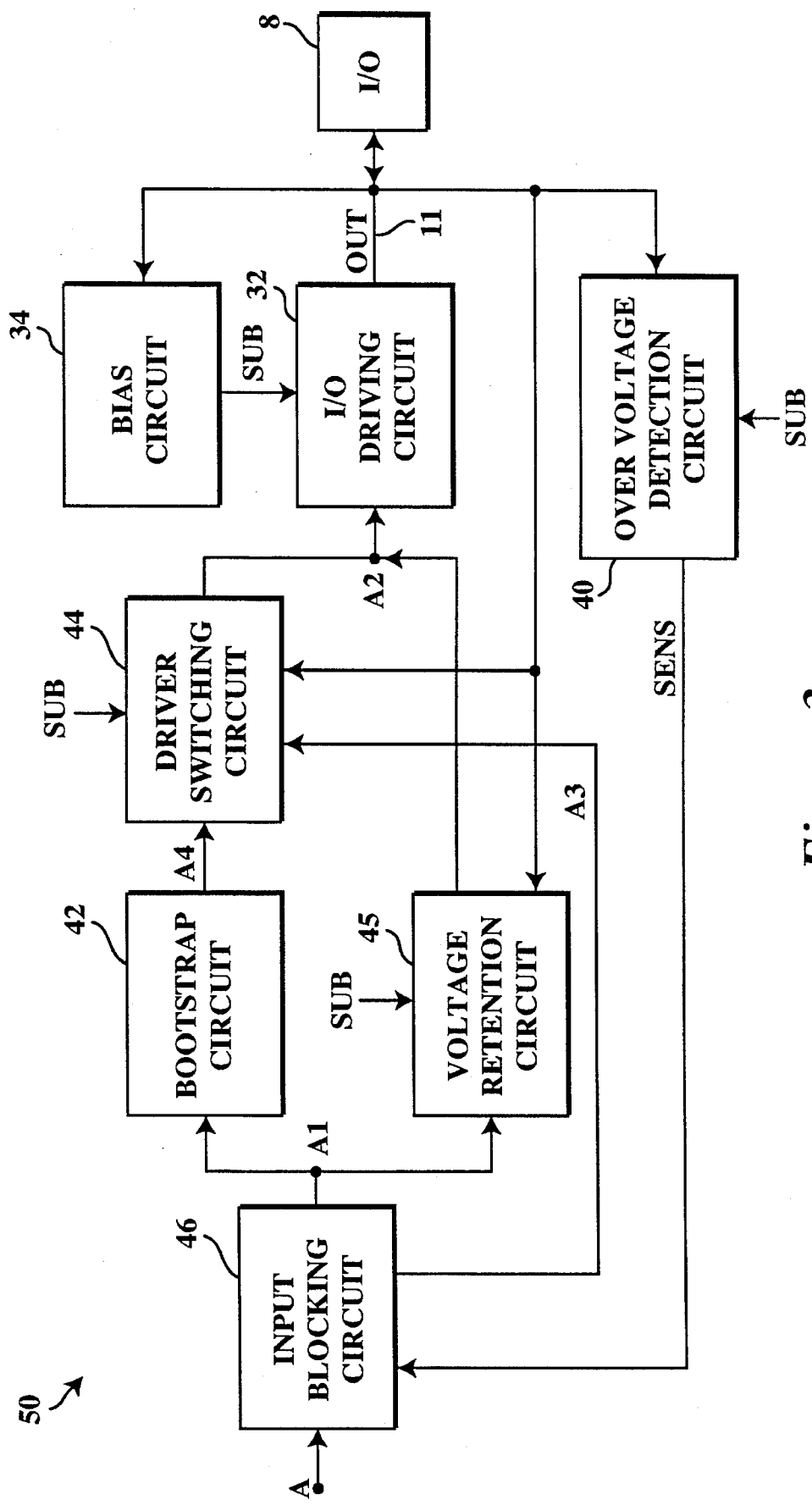
FIG. 3 is a block diagram of a pull-up portion of an output buffer circuit in accordance with an embodiment of the present invention.

FIG. 3 is a block diagram of an output buffer pull-up circuit 50 constructed in accordance with an embodiment of the present invention. Signals are received from other circuitry on the integrated circuit containing the output buffer at node A of the pull-up circuit 50, to be passed to an I/O connection 8 which may comprise, for example, an input/output pad of the IC. The I/O connection 8 is coupled to an I/O driving circuit 32, by way of an output line 11, designated as node OUT in the drawings. The I/O driving circuit 32 is also coupled with a bias circuit 34, in the manner as described above in connection with FIG. 7, in order to bias the substrate region of a PMOS driving transistor of the driving circuit 32 so as to prevent leakage current therethrough during an overvoltage condition on the node OUT. The substrate bias voltage produced by the bias circuit 34 is output therefrom on a node SUB for utilization by other components of the circuit 50 which may be exposed to an overvoltage on node OUT.

An overvoltage detection circuit 40 is coupled to receive the voltage on node OUT and produce an output SENS which is indicative of an overvoltage condition. An input blocking circuit 46 receives the output SENS from the overvoltage detection circuit as well as signals on the node A input to the output buffer pull-up circuit 50. The input blocking circuit 46 produces an output on a node A1 which is passed to both a bootstrap circuit 42 and a voltage retention circuit 45. The output blocking circuit also produces an output on a node A3 which is coupled to a driver switching circuit 44. The bootstrap circuit 42 is also arranged to pass signals on a node A4 to the driver switching circuit 44. The driver switching circuit, as mentioned, is coupled to receive signals from the input blocking circuit 46 and the bootstrap circuit 42, as well as signals produced on the output node OUT. Signals are output from the driver switching circuit on a node A2 which is used to control the I/O driving circuit 32. Also coupled for output to node A2 is the voltage retention circuit 45, in accordance with signals received therein from the aforementioned connection to node A1 and the voltage on node OUT.

The basic operation of the circuit 50 shown in FIG. 3 is as follows. The I/O driving circuit 32 is constructed to drive the node OUT to a logic-one voltage level or to a tri-state (i.e. turned off) condition according to the signal level on node A2. When the I/O driving circuit output is logic-one then it is acting as the pull-up portion of an output buffer circuit in order to drive apparatus coupled to the I/O connection 8. When the I/O driving circuit is in a tri-state condition it is because a pull-down portion of the output buffer (not shown in FIG. 3) is driving the I/O connection 8 or, for example, the I/O connection 8 is being utilized for input to other circuitry on the IC containing the buffer circuit 50. The bias circuit 34 is constructed and coupled to the I/O driving circuit in the manner described in connection with FIG. 7, and is arranged to bias the n-well substrate of the I/O driver circuit 32 to the higher of the potentials on the output node out and the supply line ($V_{CC}$).

During normal operation, input to the buffer circuit 50 is received on node A by the input blocking circuit 46. If the input on node A is a logic-zero voltage level then the driver switching circuit 44 is driven by node A3 so as to switch on the I/O driving circuit 32. If node A passes to a logic-one level, the driver switching circuit 44 is initially driven from the bootstrap circuit on node A4 so as to switch the I/O driving circuit off by way of node A2. The voltage on node A2 is then retained at a level to keep the I/O driving circuit 32 on by the voltage retention circuit 45.

In the event of an overvoltage condition on the I/O connection 8, the overvoltage detection circuit 40 produces output on the node SENS, which causes the input blocking circuit 46 to block signals on the input node A from the remainder of the buffer circuit 50. The substrate region of the I/O driving circuit 32 is biased to the voltage on node OUT by way of the bias circuit 34. Additionally, the driver switching circuit is isolated from the supply lines ($V_{CC}$ and the $V_{SS}$) because of the signal levels on nodes A3 and A4 due to output from the input blocking circuit 46. The driver switching circuit 44 instead drives the node A2 which controls the I/O driving circuit 32 to the voltage of node OUT so as to prevent the I/O driving circuit from switching on. Furthermore, the voltage retention circuit 45 is constructed so as to prevent capacitive coupling to the node A2 during recovery from an overvoltage condition (e.g. a transition from an overvoltage condition to a normal condition) from causing the I/O driving circuit to erroneously switch on when the circuit is in a tri-state condition. The operation of the output buffer pull-up circuit 50 is described in greater detail hereinbelow with reference to FIG. 4.

Figure 4:
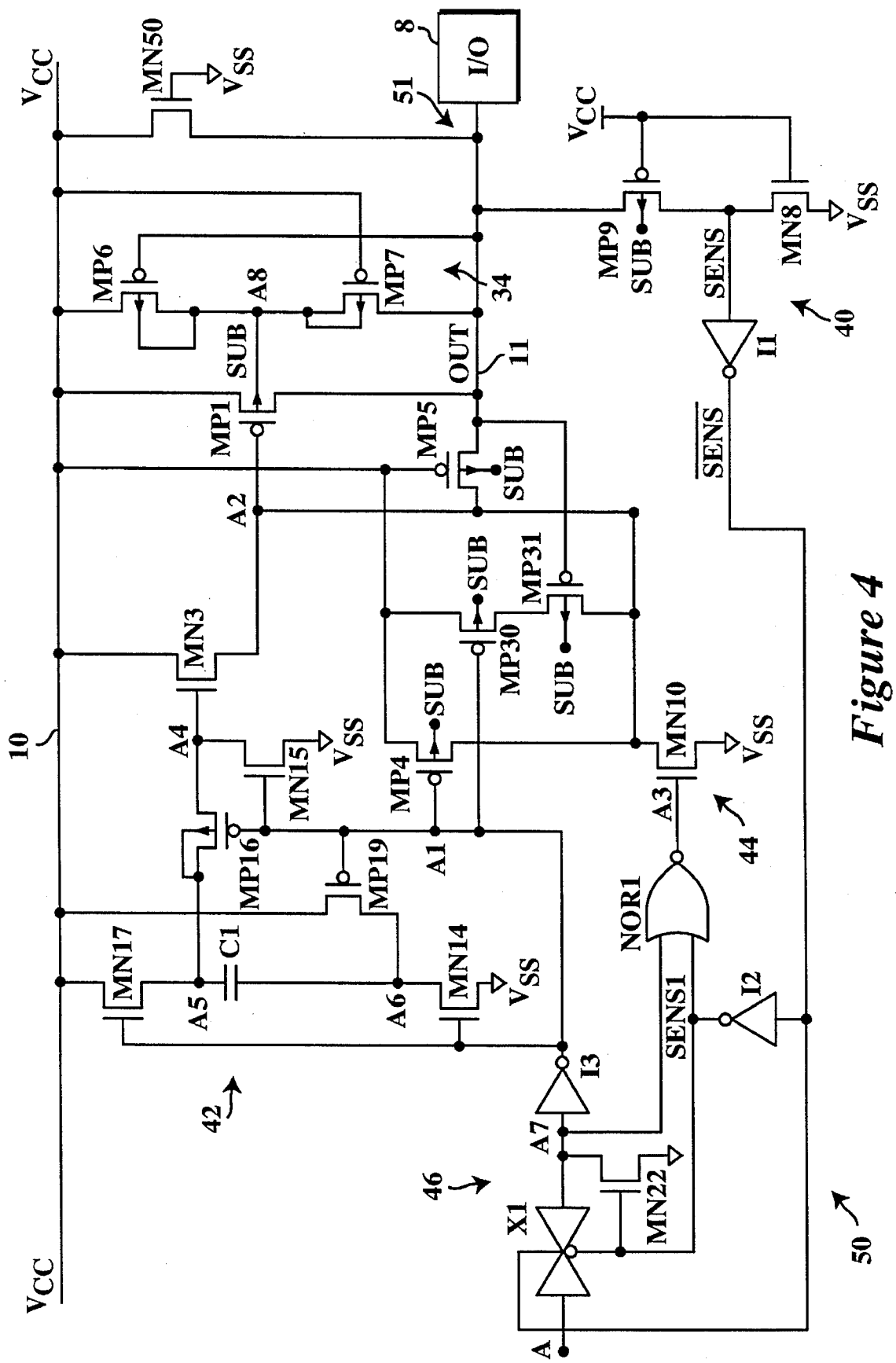
FIG. 4 is a schematic circuit diagram of a CMOS pull-up portion of an output buffer constructed according to the embodiment of FIG. 3.

In FIG. 4 there is shown a schematic circuit diagram of an output buffer pull-up circuit 50, incorporating features according to an embodiment of the present invention, and corresponding to the block diagram of FIG. 3 described above. The circuit 50 is connected to receive output control signals at an input node A, and to control the voltage at the input/output connection 8 based on the signals received at the node A. The circuit 50, as mentioned comprises generally a plurality of interconnected circuit portions, including an output blocking circuit 46, a bootstrap circuit 42, an I/O driving circuit 32, a bias circuit 34, an overvoltage detection circuit 40, a voltage retention circuit 45, and a driver switching circuit 44. The operation of each of these circuit portions is described in detail hereinbelow.

The driving circuit 32 and bias circuit 34 shown in FIG. 4 correspond to the driving circuit and bias circuit blocks shown in FIGS. 3 and 7. The driving circuit 32 comprises a PMOS transistor MP1 having respective conduction terminals (source/drain) coupled to the supply line 10 and output line 11 (node OUT). The gate voltage of transistor MP1 is controlled from a node A2 by direct electrical connection thereto. The driving transistor MP1 is also fabricated in an n-well (not shown) which is coupled to receive a biasing voltage from a node designated in FIG. 4 by SUB. Those skilled in the art will recognize that the driving circuit need not be limited to a single driving transistor. If greater current sourcing/sinking is required, additional driving transistors may be coupled in parallel with transistor MP1.

For example, another driving transistor can be provided having respective conduction terminals connected to the supply line 10 and output line 11 and having a substrate region connection to the node SUB. In order to provide for noise and edge rate control of the buffer circuit, the gate of the additional driving transistor can be coupled to the node A2 by way of a resistive element. Further noise control can be provided by a resistive element coupled between the node A2 and its connection to the conduction terminals of transistors MP31, MP4 and MN10, in place of the direct electrical connection shown in FIG. 4.

The bias circuit 34 comprises two PMOS transistors MP6, MP7 which may be fabricated in the same n-well region as driving transistor MP1. The bias transistors MP6, MP7 are connected in series between the supply line 10 and output line 11, the transistor MP6 having its conduction terminals connected to the supply line 10 and a common node A8, and the transistor MP7 having its conduction terminals connected to the common node A8 and the output node OUT. The common node A8 is also connected to the n-well region containing the driving transistor MP1, so as to provide the biasing voltage to the node SUB. The connection of common node A8 to the n-well region can be made in conventional form, such as by way of a split or merged contact as is known in the art. The gate terminal of bias transistor MP6 is coupled to the output node OUT, and the gate of MP7 coupled to supply line 10. This configuration allows the bias circuit function described above to be achieved. In particular, during normal operation when supply line 10 is at normal supply voltage (e.g., $V_{CC}$ approximately 3.0 volts), and the potential at I/O connection 8 is within the ordinary operating range (e.g., 0 to 3 volts), transistor MP7 is turned off and transistor MP6 is turned on and connects the node A8 and n-well region connection SUB to supply line 10. Conversely, when an overvoltage condition occurs such as the potential on output line 11 (OUT) is driven higher than the potential on supply line 10, transistor MP6 turns off, thus isolating the n-well connection SUB from the supply line 10, and transistor MP7 turns on, coupling the common node A8 and the n-well region to the output line 11. In this way, the bias circuit 34 ensures that the potential of the n-well, through its connection SUB, is at least substantially as high as the larger of the respective potentials on supply line 10 and output line 11.

The overvoltage detection circuit 40 comprises PMOS transistor MP9, NMOS transistor MN8 which are coupled to inverting buffers I1 and I2 of the input blocking circuit 46. This circuit is provided in order to sense when an overvoltage condition occurs and output a signal accordingly to facilitate control of various other portions of the output buffer pull-up circuit by way of the input blocking circuit 46. The PMOS transistor MP9 connects the output node OUT to a node SENS, and has its gate terminal connected to $V_{CC}$. Since the transistor MP9 is also subjected to overvoltage conditions, being coupled to output line 11, this transistor may also be fabricated in the same n-well region as driving transistors MP1, MP2 and bias transistors MP6, MP7, or may be fabricated in a an n-well region which is biased to the same potential, by connection to the reference voltage node SUB, as the n-well 36 containing driving transistor MP1. The NMOS transistor MN8 of the overvoltage sensing circuit connects between the node SENS and $V_{SS}$, and also has its gate terminal controlled by the $V_{CC}$ potential. Thus, when the potential on output line 11 is greater than $V_{CC}$ (an overvoltage condition) transistor MP9 turns on and pulls node SENS up to the voltage at output line 11. The transistor MN8 is constructed as a very weak device (i.e., a long and narrow NMOS channel with its W/L ratio being small) to enable MP9 to drive node SENS to a logic high potential. For a definition of the W/L ratio, see pages 40 & 151 of *Principles of CMOS VLSI Design*, N. West and K. Esahraghian, Addison- Wesley Publishing, 1985.

The output blocking circuit 46 comprises a CMOS transmission gate X1 which has an input from node A, and an output coupled to a node A7. The control terminals of the transmission gate X1 are controlled from the overvoltage detection circuit 40 by way of inverting buffers I1 and I2 such that, when an overvoltage condition occurs, the transmission gate X1 prevents signals passing from node A to node A7. Furthermore, an NMOS transistor MN22 is coupled from node A7 to $V_{SS}$, and controlled by the overvoltage detection circuit 40 through I1, I2 to pull node A7 to $V_{SS}$ (which may for example be ground) during an overvoltage condition. The logic level at node A7 is inverted by an inverting buffer I3 and output to a node A1 which controls both the bootstrap circuit 42 and voltage retention circuit 45.

An NMOS switching transistor MN3 which forms part of the driver switching circuit 44 connects node A2 (the gate node of driving transistor MP1) to supply line 10, and it is controlled from an output node A4 of the boot strap circuit 42. Boot strap circuit 42 comprises a chargeable capacitive element C1 coupled in series between two NMOS transistors MN14 and MN17. The transistor MN17 connects supply line 10 to a node A5 at one side of the capacitive element C1, and transistor MN14 connects a node A6 at the other side of capacitive element C1 to $V_{SS}$. The gates of both NMOS transistors MN14 and MN17 are controlled from node A1. The node A5 is coupled to node A4 at the gate of switching transistor MN3 by way of a PMOS transistor MP16, the gate of which it is controlled by the potential at node A1. Furthermore, the node A6 is coupled to supply line 10 by way of another PMOS transistor MP19 which is also controlled from node A1. An NMOS pull-down transistor MN15, also controlled from node A1, couples node A4 to $V_{SS}$, which may be, for example, ground.

The driver switching circuit 44 also includes an NMOS transistor NM10 which couples between node A2 and $V_{SS}$ and is controlled by node A3 from the input blocking circuit 46. Signals on node A3 are generated through a NOR gate NOR1 of the input blocking circuit, in accordance with the logic levels on node A7 and the output of inverting buffer I2 (SENS1). The other component of the driver switching circuit 44 is a PMOS transistor MP5 which connects the node OUT to A2 and is controlled from the supply line 10 ($V_{CC}$). The substrate region of MP5 is connected to the bias circuit node SUB.

Finally, the voltage retention circuit 45 comprises a PMOS leakage transistor (small W/L ration) MP4 which couples between node A2 and $V_{CC}$ and is controlled from node A1. Additional PMOS transistors MP30 and MP31 are coupled in series between A2 and $V_{CC}$ with MP30 being connected on the $V_{CC}$ side and controlled from node A1, and MP31 connected on the A2 side and controlled from the output node OUT. Since the voltage retention circuit PMOS transistors are subject to application of an overvoltage applied to OUT they are also supplied with the substrate bias voltage from SUB.

The gate node (A2) of driving transistor MP1 is connected to the output line 11 by way of a PMOS transistor MP5 which has its gate coupled to the supply line voltage $V_{CC}$. When an overvoltage condition occurs the voltage at the conduction terminal of MP5 connected to output line 11 exceeds the potential at the gate thereof, which switches on transistor MP5 to connect node A2 with output line 11. This ensures that the gate of driving transistor MP1 is switched off during an overvoltage condition, since $V_{GS}$ for MP1 is approximately zero. However, since switching transistor MN3 is also coupled to node A2, this transistor must be relatively large (in order to drive the load of driving transistor MP1) and NMOS, so that when node A2 reaches a voltage greater than $V_{CC}$ during an overvoltage condition current is not injected from the output line 11 to supply line 10 through transistor MN3. The boot strap circuit 42 allows the NMOS transistor MN3 to drive node A2 all the way to $V_{CC}$ to turn off driving transistor MP1 during normal high to low transitions, by the action described hereinbelow.

During normal operation (no overvoltage condition) the CMOS transmission gate X1 conducts signals from node A to node A7. Thus when node A is driven low by circuits on the IC which are coupled to node A, node A7 is also low, and node A1 is driven high by inverting buffer I3. Since node A1 is high, NMOS transistors NM14 and NM17 are on, which couples capacitive element C1 to charge between $V_{CC}$ and $V_{SS}$. Node A1 being high also causes PMOS transistors MP16 and MP19 to be switched off, and NMOS transistor NM15 pulls node A4 to $V_{SS}$, ensuring that transistor MN3 is off. In this instance, node A2 is driven from transistor NM10 of the driver switching circuit 44 as described below.

When node A is driven high, transistors MN14 and MN17 are switched off by the potential at node A1, and PMOS transistor MP19 switches on, clamping node A6 on the low voltage side of capacitive element C1 to $V_{CC}$. PMOS transistor MP16 also switches on, which drives the node A4 to approximately $V_{CC}$ plus 2 volts by virtue of the charged condition of capacitive element C1 and the clamping action of transistor MP19. The large potential at node A4 on the gate of transistor MN3 allows transistor MN3 to drive node A2 all the way to supply voltage $V_{CC}$ to ensure proper operation of driving transistor MP1, MP2, even though transistor MN3 is an NMOS device.

When the boot strap action of circuit 42 turns on transistor MN3 so as to switch off the driving transistors, eventually the charge in the capacitor C1 which controls the gate voltage of MN3 decays due to leakage currents. Therefore, the voltage retention circuit provides PMOS transistor MP4 to couple node A2 to $V_{CC}$ when node A1 is driven low, so as to maintain the I/O driving circuit (transistor MP1) in an off state even if transistor MN3 switches off due to charge decay at node A4. However, MP4 is only a very weak device (small W/L ratio) so that when an overvoltage condition occurs and transistor MP5 switches on, only a small leakage current flows from the output line 11 to $V_{CC}$ by way of MP5 and MP4. The NOR gate NOR1 at the input of transistor MN10 acts to turn off MN10 and allow node A2 to float whenever overvoltage condition occurs and whenever a logic high state is applied to node A.

The additional voltage retention circuit transistors MP30 and MP31 are provided to avoid erroneous switching of the I/O driving circuit 32 when the buffer circuit 50 is in tri-state (i.e. turned off) and the voltage signal at the I/O connection 8 passes from an overvoltage condition to a normal condition (i.e. <$V_{CC}$) in a short period of time (e.g. 3 to 10 nanoseconds, being the expected signal edge rate from a 5 volt device connected to the I/O connection 8). Because of capacitive coupling from the I/O connection 8 and output node OUT to node A2, the falling voltage acts to draw node A2 below $V_{CC}$ when the voltage on OUT is taken from overvoltage to less than $V_{CC}$ fairly rapidly. In this situation, transistor MP4 does not have enough current sinking/sourcing capacity to keep A2 at $V_{CC}$, which can cause driving transistor MP1 to turn on for a period of time until MP4 can recover. Without the provision of MP30 and MP31, this situation can result in a current spike from the buffer circuit 50 to the apparatus coupled to I/O connection 8, which is undesirable. The operation of voltage retention transistors MP30 and MP31 provides an additional current path between node A2 and $V_{CC}$ upon such a transition of the node OUT from >$V_{CC}$ to <$V_{CC}$. However, the MP30/MP31 configuration does not provide a leakage path (as MP4 does) in the overvoltage condition because node A1 is at voltage $V_{CC}$ in this situation so as to retain transistor MP30 in an off state regardless of the voltage applied to the I/O connection 8.

It will be apparent to those skilled in the art from an examination of the circuit illustrated in FIG. 4 that the n-well substrate of each PMOS transistor in the output buffer pull-up circuit which may be exposed to an overvoltage condition from the input/output connection 8 has its n-well potential controlled by the bias circuit 34 which generates the biasing voltage SUB. In this instance, this includes PMOS transistors MP6, MP7 from the bias circuit itself, driving transistor MP1, and transistors MP4, MP5, MP9, MP30 and MP31. It will also be apparent that during an overvoltage condition the only current path from the output line 11 to $V_{CC}$ is by way of the weak PMOS devices MP4 and MP9. Using current n-well CMOS processing technology, the leakage current from output line 11 to $V_{CC}$ has been measured at about 15 micro amps for a $V_{CC}$ voltage of 3.0 volts at 0 degrees Celsius and with 5.5 volts applied to the input/output connection.

Figure 6:
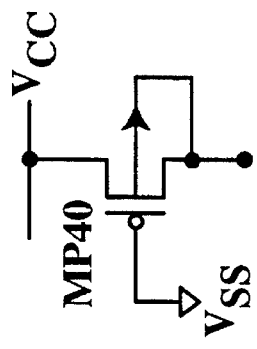
FIG. 6 is a diagram of an additional component of a bias circuit for the embodiment of FIG. 4.

The bias circuit 34 may be provided with an additional n-well region bias transistor in the form of a small PMOS leakage device MP40 for connecting the n-well region SUB to $V_{CC}$, as illustrated in FIG. 6. This additional bias transistor MP40 is useful because when there is a very small DC current load on the input/output connection 8, the output line 11 will be substantially at the same potential as supply line $V_{CC}$, which may cause the n-well biasing voltage node SUB to be disconnected from both the output line 11 and supply line 10 by the bias circuit 34. This leakage transistor MP40 should, however, be only a weak device having a long and narrow channel—that is, its W/L ratio should be small.

The PMOS transistor MP16 of the boot strap circuit 42 is assumed to be in an isolated n-well of its own so that both the source and n-well thereof which are connected to node A5 can raise to a potential greater than $V_{CC}$ without clamping to $V_{CC}$ though forward biasing of the drain/source diodes of MP16.

A breakdown NMOS transistor MN50 coupled between the supply line 10 and output line 11 and having a gate terminal connected to $V_{SS}$ may additionally be provided as shown in FIG. 4 in order to facilitate latch-up and electrostatic discharge (ESD) testing of the integrated circuit. This is because the output buffer pull-up circuit of the present invention acts to stop current being injected from the input/output connection to $V_{CC}$ which is the mechanism ordinarily relied on during latch-up and ESD testing in order to protect the internal circuits from damage. The breakdown transistor MN50 should be designed so as to not break down until the potential on output line 11 is about 10 volts greater than $V_{CC}$, which is outside the 5 volt tolerant normal operating range of the output buffer.

Figure 5:
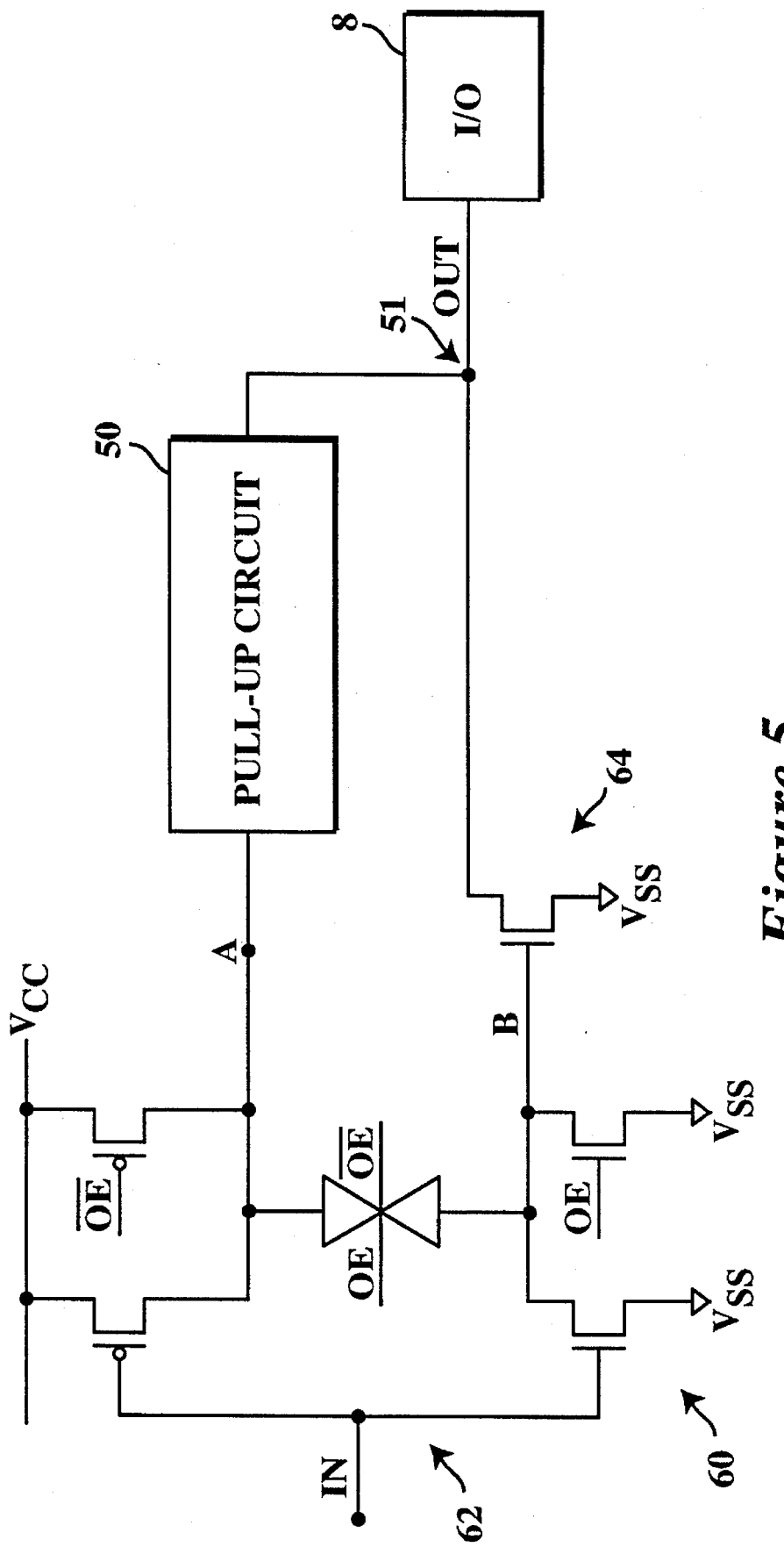
FIG. 5 is a circuit diagram of a pull-down portion of a CMOS output buffer.

Referring now to FIG. 5, an example of a pull-down portion of an output buffer circuit 60 is shown which can be utilized in conjunction with a circuit 50 shown and described hereinabove. The pull-down circuit 60 is of a generally conventional construction, and comprises an inverting output enable stage 62, and a driving stage 64. The output enable stage 62 receives output signals from other circuits in the integrated circuit at the IN node, and drives node A at the input of the pull-up circuit 50 and node B at the input of the driving stage 64 of the pull-down circuit. The output 51 of the pull-up circuit 50 is coupled to the I/O connection 8.

It will be appreciated by those skill in the art that the forgoing detailed description of the invention has been put forward by way of example only, and that many modifications can be made to the described construction while remaining within the spirit and scope of the present invention as defined in the claims appended hereto.

What is claimed is:

1. A semiconductor output interface circuit fabricated with CMOS technology using an n-well process, comprising:

at least one PMOS driving transistor constructed in an n-well region of a semiconductor substrate, coupled to drive an input/output connection, the input/output connection being a contact pad for an integrated circuit fabricated with CMOS technology using an n-well process and constructed on a semiconductor body which includes said substrate, and coupled to a reference voltage, the at least one PMOS driving transistor forming a pull-up circuit of an output buffer which outputs signals from other circuits in said integrated circuit to an electrical apparatus connected to said contact pad;

an overvoltage protection circuit comprising a first PMOS bias transistor coupled between the reference voltage and a first node and controlled by a voltage at said input/output connection, and a second PMOS bias transistor coupled between said first node and said input/output connection and controlled by the reference voltage, the first and second bias transistors being formed in the same n-well as the at least one driving transistor; and a leakage transistor coupled to provide a leakage current from the reference voltage to the region, wherein said first node is electrically coupled to said n-well region of said substrate such that the n-well region is biased substantially to the voltage of greater magnitude as between the reference voltage and the voltage at the input/output connection.

2. An integrated circuit output buffer for passing signals from an integrated circuit to an input/output contact pad, comprising:

a driving circuit for outputting electrical signals to an electrical apparatus coupled to said contact pad in accordance with signals output from the integrated circuit, the driving circuit including at least one pull-up transistor formed on a region of a semiconductor substrate, said electrical apparatus being separate from said integrated circuit;

an overvoltage protection circuit coupled to a voltage supply conductor, the region and the input/output contact pad and responsive to a potential difference as between the voltage supply conductor and the contact pad so as to bias said region to prevent the potential at conduction terminals of the at least one pull-up transistor from substantially exceeding the potential of said region; and a leakage transistor coupled to provide a leakage current from the voltage supply conductor to the region, wherein the overvoltage protection circuit comprises first and second bias transistors coupled in series from the voltage supply conductor to the input/output contact pad, a node between the series connected bias transistors being coupled to said region, the gate of the first transistor being controlled by a voltage on the contact pad and the gate of the second transistor being controlled by a voltage on the supply conductor.

3. An integrated circuit output buffer for passing signals from an integrated circuit to an input/output contact pad, comprising:

a driving circuit for outputting electrical signals to an electrical apparatus coupled to said contact pad in accordance with signals output from the integrated circuit, the driving circuit including at least one pull-up transistor formed on a region of a semiconductor substrate, said electrical apparatus being separate from said integrated circuit;

an overvoltage protection circuit coupled to a voltage supply conductor, the region and the input/output contact pad and responsive to a potential difference as between the voltage supply conductor and the contact pad so as to bias said region to prevent the potential at conduction terminals of the at least one pull-up transistor from substantially exceeding the potential of said region; and an output switching circuit for controlling the at least one driving transistor in accordance with signals output from the integrated circuit, the output switching circuit comprising:

an NMOS switching transistor for controlling the voltage at a gate node of said at least one driving transistor;

a pre-charge circuit constructed to store charge while the integrated circuit output is at a first logic level and to drive the gate node of the switching transistor above the voltage on said voltage supply conductor on transition of the integrated circuit output from the first logic level to a second logic level, wherein the overvoltage protection circuit comprises first and second bias transistors coupled in series from the voltage supply conductor to the input/output contact pad, a node between the series connected bias transistors being coupled to said region, the gate of the first transistor being controlled by a voltage on the contact pad and the gate of the second transistor being controlled by a voltage on the supply conductor.

4. An output buffer according to claim 3, wherein the pre-charge circuit comprises:

a capacitive element coupled between the voltage supply conductor and a reference voltage by way of respective charging transistors, the charging transistors being coupled to charge the capacitive element during said first logic level at the integrated circuit output;

a clamping transistor for coupling the low voltage side of the capacitive element to the voltage supply conductor upon transition of the integrated circuit output to the second logic level; and a passing transistor for coupling the high voltage side of the capacitive element to the gate node of the switching transistor upon said logic level transition.

5. An output buffer according to claim 3, wherein the output switching circuit includes a leakage transistor for coupling the switching transistor gate node to the voltage supply conductor while the integrated circuit output is at said second logic level.

6. An output buffer according to claim 3, including an overvoltage sensing circuit for detecting an overvoltage condition when the potential at the input/output contact pad exceeds the potential at the voltage supply conductor.

7. An output buffer according to claim 6, further comprising additional overvoltage protection circuitry including:

a blocking circuit for blocking said output signals from the integrated circuit on detection of an overvoltage condition by the overvoltage sensing circuit; and circuitry for raising the potential at the gate node of said at least one driving transistor to substantially the same potential as the input/output contact pad during an overvoltage condition.

8. An integrated circuit output interface circuit, comprising:

an output driving circuit for driving an output connection of the integrated circuit in accordance with signals from said integrated circuit;

a substrate bias circuit for providing a bias voltage to said output driving circuit upon an overvoltage condition at said output connection;

an input blocking circuit for blocking said signals from said output driving circuit during said overvoltage condition; and a driver switching circuit coupled to receive said signals from the input blocking circuit to control a pull-up transistor of the output driving circuit by switching said pull-up transistor between an on state and an off state.

9. An output interface circuit according to claim 8, further comprising an overvoltage detection circuit for outputting a detection signal during said overvoltage condition, said detection signal being received by the input blocking circuit to effect blocking of said signals and to cause said driver switching circuit to switch said pull-up transistor of the output driving circuit to said off state.

10. An output interface circuit according to claim 8, wherein said pull-up transistor comprises a p-type transistor and said driver switching circuit includes an n-type transistor coupled to switch said pull-up transistor to said off state.

11. An output interface circuit according to claim 10, wherein said driver switching circuit n-type transistor is coupled to supply a reference voltage to a control node of said p-type pull-up transistor upon application of a switching signal to a control node of said n-type transistor, said output interface circuit further including a bootstrap circuit for generating a voltage higher than said reference voltage for application as said switching signal to said n-type transistor.

12. An output interface circuit according to claim 11, further including a voltage retention circuit for maintaining said pull-up transistor control node at least substantially at said reference voltage following application of said switching signal and during said overvoltage condition.

13. A method for controlling a CMOS output buffer circuit comprising a p-type pull-up transistor which is coupled to an output connection of the buffer circuit and which is switched to a conductive state in accordance with a first input signal level and to a non-conductive state in accordance with a second input signal level, the method comprising:

applying a bias voltage to a substrate region of said p-type pull-up transistor during a condition where in an applied voltage at said output connection substantially exceeds a reference voltage of the buffer circuit;

coupling said applied voltage to a control node of said pull-up transistor during said condition; and blocking said input signal during said condition, wherein an n-type switching transistor is provided to switch said pull-up transistor to said non-conductive state in accordance with said second input signal level, including generating a switching voltage which is greater than said reference voltage, in response to said second signal level, for controlling said switching transistor.

14. An integrated circuit output interface circuit, comprising:

an output driving circuit for driving an output connection of an integrated circuit in accordance with an output signal from said integrated circuit;

an overvoltage detection circuit coupled to said output connection, said overvoltage detection circuit outputting a detection signal during an overvoltage condition at said output connection;

an output blocking circuit, coupled to said overvoltage detection circuit to receive said detection signal, said output blocking circuit blocking said output signal from said output driving circuit during said overvoltage condition; and a driver switching circuit coupled to receive said output signal from the output blocking circuit to control a pull-up transistor of the output driving circuit by switching said pull-up transistor between an on-state and an off-state in accordance with said output signal, said driver switching circuit switching said pull-up transistor to said off-state during said overvoltage condition.

15. An integrated circuit output interface circuit as claimed in claim 14, wherein said driver switching circuit comprises:

a switching transistor coupled to said pull-up transistor, said switching transistor controlling the voltage at a control node of said pull-up transistor; and a pre-charge circuit coupled to said switching transistor, said pre-charge circuit storing charge when said output signal is in a first state, and driving the gate node of the switching transistor above a supply voltage for the integrated circuit on transition of said output signal to a second state.

16. An integrated circuit output interface circuit comprising:

at least one output driving transistor, said at least one output driving transistor driving an output connection of an integrated circuit in accordance with an output signal from said integrated circuit; and an output switching circuit coupled to a control node of said at least one output driving transistor, said output switching circuit switching said at least one output driving transistor in accordance with said output signal, the output switching circuit comprising:

a switching transistor coupled to a control node of said at least one output driving transistor and coupled to a supply voltage of the integrated circuit;

a pre-charge circuit coupled to said switching transistor and coupled to receive said output signal, the pre-charge circuit storing charge when said output signal is in a first state and driving a control node of said switching transistor above said supply voltage on transition of said output signal to a second state;

an overvoltage detection circuit for outputting a detection signal during an overvoltage condition at said output connection; and an output blocking circuit, coupled to receive said detection signal, for blocking said output signal from said output switching circuit during said overvoltage condition.

* * * * *